United States Patent
Kang

(10) Patent No.: US 10,643,731 B2
(45) Date of Patent: May 5, 2020

(54) SEMICONDUCTOR MEMORY APPARATUS

(71) Applicant: SK hynix Inc., Icheon-si Gyeonggi-do (KR)

(72) Inventor: Jae Seok Kang, Seoul (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 16/167,825

(22) Filed: Oct. 23, 2018

(65) Prior Publication Data

US 2019/0164622 A1 May 30, 2019

(30) Foreign Application Priority Data

Nov. 29, 2017 (KR) .................. 10-2017-0161584

(51) Int. Cl.
| | | |
|---|---|---|
| G11C 11/34 | (2006.01) | |
| G11C 29/24 | (2006.01) | |
| G11C 11/4099 | (2006.01) | |
| G11C 11/408 | (2006.01) | |
| G11C 11/4094 | (2006.01) | |
| G11C 29/18 | (2006.01) | |

(52) U.S. Cl.
CPC .......... *G11C 29/24* (2013.01); *G11C 11/4085* (2013.01); *G11C 11/4087* (2013.01); *G11C 11/4094* (2013.01); *G11C 11/4099* (2013.01); *G11C 2029/1802* (2013.01)

(58) Field of Classification Search
CPC . G11C 29/24; G11C 11/4085; G11C 11/4087; G11C 11/4094; G11C 11/4099; G11C 2029/1802

See application file for complete search history.

(56) References Cited

U.S. PATENT DOCUMENTS

| | | | | |
|---|---|---|---|---|
| 6,415,399 B1 * | 7/2002 | Yamaoka | ............... | G11C 29/10 |
| | | | | 365/201 |
| 6,563,743 B2 * | 5/2003 | Hanzawa | ................. | G11C 7/14 |
| | | | | 257/E27.005 |
| 7,916,573 B2 * | 3/2011 | Yoo | ...................... | G11C 29/842 |
| | | | | 365/189.07 |

FOREIGN PATENT DOCUMENTS

| | | |
|---|---|---|
| KR | 1020140083592 A | 7/2014 |
| KR | 1020150064449 A | 6/2015 |

* cited by examiner

*Primary Examiner* — Pho M Luu
(74) *Attorney, Agent, or Firm* — William Park & Associates Ltd.

(57) ABSTRACT

A semiconductor memory apparatus includes a test decoding select circuit. The test decoding selective circuit is configured to generate a normal decoding enable signal, a redundancy decoding enable signal, and a dummy decoding enable signal, in response to a test entry signal, a test code, and an active signal.

19 Claims, 2 Drawing Sheets

SEMICONDUCTOR MEMORY APPARATUS

CROSS-REFERENCES TO RELATED APPLICATION

The present application claims priority under 35 U.S.C. § 119(a) to Korean application number 10-2017-0161584, filed on Nov. 29, 2017, in the Korean Intellectual Property Office, which is incorporated herein by reference in its entirety.

BACKGROUND

1. Technical Field

Various embodiments generally relate to a semiconductor integrated circuit, and more particularly, to a semiconductor memory apparatus.

2. Related Art

A semiconductor memory apparatus is configured to store data at a location designated by an address and to output data stored at a location designated by an address.

The semiconductor memory apparatus performs an operation of designating a location at which data is to be stored or a location of stored data by selecting a bit line and a word line in response to an address.

In the semiconductor memory apparatus, redundancy lines are disposed to substitute for a bit line or a word line when the bit line or word line is defective. Furthermore, in the semiconductor memory apparatus, dummy lines are disposed in electrically vulnerable regions. Here, the redundancy lines include a line capable of substituting for a bit line and a line capable of substituting for a word line. The dummy lines also include a line disposed for bit lines and a line disposed for word lines.

In the semiconductor memory apparatus, if a line defect occurs, it is not easy to discern a defective line since a large number of lines are electrically coupled to each other.

SUMMARY

In an embodiment, a semiconductor memory apparatus may include a test decoding select circuit configured to generate a normal decoding enable signal, a redundancy decoding enable signal, and a dummy decoding enable signal, in response to a test entry signal, a test code, and an active signal.

In an embodiment, a semiconductor memory apparatus may include a normal line decoding circuit configured to selectively enable a normal line in response to an address and the normal decoding enable signal.

In an embodiment, a semiconductor memory apparatus may include a redundancy line decoding circuit configured to selectively enable a redundancy line in response to the address and the redundancy decoding enable signal.

In an embodiment, a semiconductor memory apparatus may include a dummy line decoding circuit configured to selectively enable a dummy line in response to the address and the dummy decoding enable signal.

In an embodiment, a semiconductor memory apparatus may include a test decoding select circuit configured to generate a normal decoding enable signal, a redundancy decoding enable signal, and a dummy decoding enable signal, in response to a test entry signal, a test code, and an active signal. The semiconductor memory apparatus may additionally include a normal line decoding circuit configured to selectively enable a normal line in response to an address and the normal decoding enable signal. semiconductor memory apparatus also include a redundancy line decoding circuit configured to selectively enable a redundancy line in response to the address and the redundancy decoding enable signal. The semiconductor memory apparatus may further include a dummy line decoding circuit configured to selectively enable a dummy line in response to the address and the dummy decoding enable signal.

DETAILED DESCRIPTION

Figure 1:
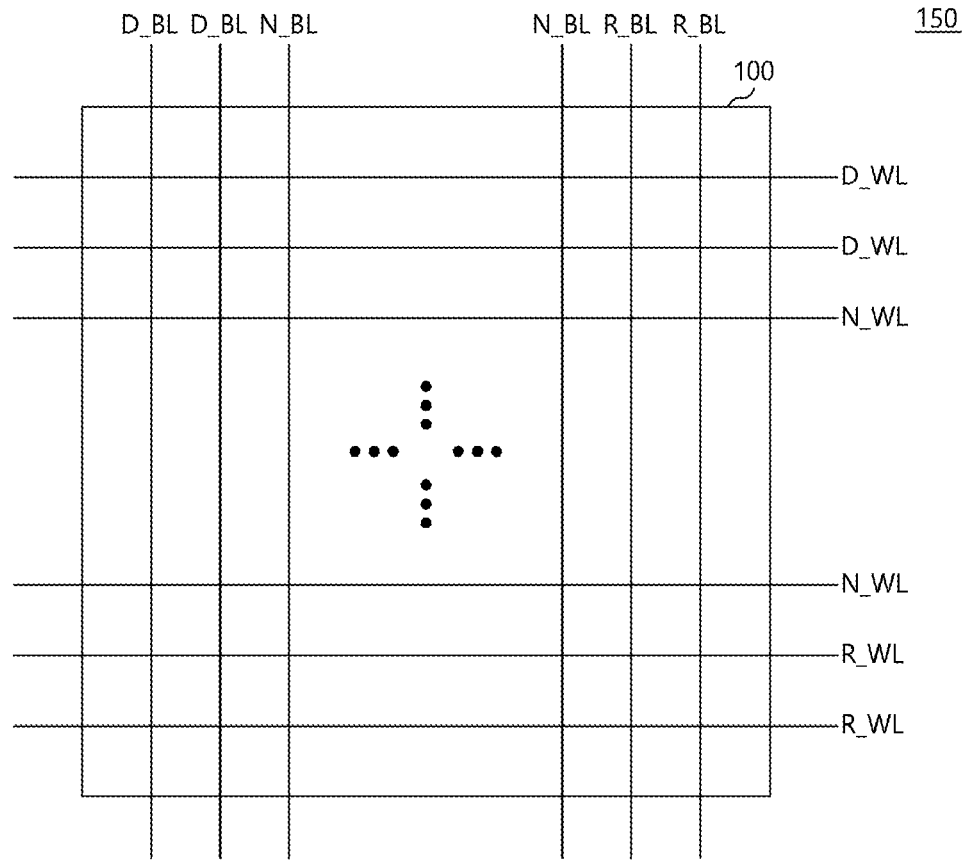
FIG. 1 shows a diagram for describing a semiconductor memory apparatus, in accordance with an embodiment.

As shown in FIG. 1, a semiconductor memory apparatus 150 in accordance with an embodiment may include a data storage region 100.

The data storage region 100 may include a plurality of bit lines D_BL, R_BL, and N_BL, and a plurality of word lines D_WL, R_WL, and N_WL. Furthermore, the data storage region 100 may include memory cells which are electrically coupled between the bit lines and the word lines. The data storage region 100 having the above-mentioned configuration may store data in a memory cell coupled between a selected bit line and a selected word line, or may output data stored in a memory cell coupled between a selected bit line and a selected word line. Here, the plurality of bit lines may include a dummy bit line D_BL, a redundancy bit line R_BL, and a normal bit line N_BL. The plurality of word lines may include a dummy word line D_WL, a redundancy word line R_WL, and a normal word line N_WL. The normal bit line N_BL and the normal word line N_WL may be lines capable of performing an operation pertaining to data storage and data output of the semiconductor memory apparatus 150. The redundancy bit line R_BL and the redundancy word line R_WL may be lines for substituting for a defective normal bit line N_BL and a defective normal word line N_WL. The dummy bit line D_BL and the dummy word line D_WL may be lines which are not substantially operated but may be disposed during a process or design, as needed.

In the semiconductor memory apparatus 150 in accordance with the embodiment, one of the normal bit line, the redundancy bit line, and the dummy bit line is selected, and a test may be performed on the selected bit line. Furthermore, in the semiconductor memory apparatus 150 in accordance with the embodiment, one of the normal word line, the redundancy word line, and the dummy word line is selected, and a test may be performed on the selected word line. Hereinafter, in the following description, the normal bit line and the normal word line may be referred to as normal lines, the redundancy bit line and the redundancy word lines may be referred to as redundancy lines, and the dummy bit line and the dummy word line may be referred to as dummy lines.

Figure 2:
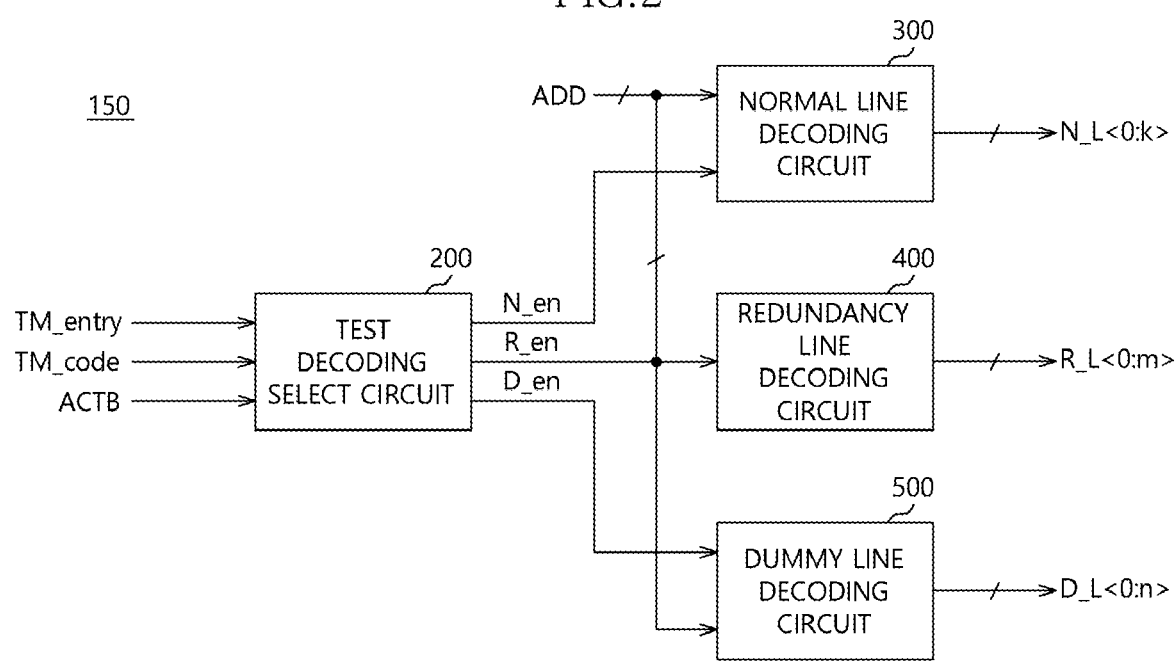
FIG. 2 shows a diagram illustrating a configuration of the semiconductor memory apparatus, in accordance with an embodiment.

As shown in FIG. 2, the semiconductor memory apparatus 150 in accordance with an embodiment may include a test decoding select circuit 200, a normal line decoding circuit 300, a redundancy line decoding circuit 400, and a dummy line decoding circuit 500.

The test decoding select circuit 200 may generate a normal decoding enable signal N_en, a redundancy decoding enable signal R_en, and a dummy decoding enable signal D_en, in response to a test entry signal TM_entry, a test code TM_code, and an active signal ACTB. For example, the test decoding select circuit 200 may enable one of the normal decoding enable signal N_en, the redundancy decoding enable signal R_en, and the dummy decoding enable signal D_en, in response to the test entry signal TM_entry, the test code TM_code, and the active signal ACTB.

The normal line decoding circuit 300 may selectively enable a plurality of normal lines N_L<0:k> in response to the normal decoding enable signal N_en and an address ADD. For example, when the normal decoding enable signal N_en is enabled, the normal line decoding circuit 300 may decode the address ADD and enable one of the plurality of normal lines N_L<0:k>.

The redundancy line decoding circuit 400 may selectively enable a plurality of redundancy lines R_L<0:m> in response to the redundancy decoding enable signal R_en and the address ADD. For example, when the redundancy decoding enable signal R_en is enabled, the redundancy line decoding circuit 400 may decode the address ADD and enable one of the plurality of redundancy lines R_L<0:m>.

The dummy line decoding circuit 500 may selectively enable a plurality of dummy lines D_L<0:n> in response to the dummy decoding enable signal D_en and the address ADD. For example, when the dummy decoding enable signal D_en is enabled, the dummy line decoding circuit 500 may decode the address ADD and enable one of the plurality of dummy lines D_L<0:n>.

Figure 3:
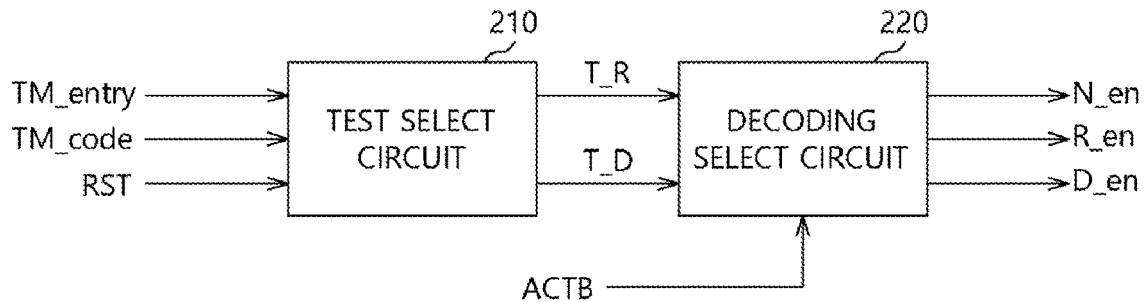
FIG. 3 shows a diagram illustrating a configuration of a test decoding select circuit of FIG. 2.

As shown in FIG. 3, the test decoding select circuit 200 may include a test select circuit 210 and a decoding select circuit 220.

The test select circuit 210 may generate a redundancy test signal T_R and a dummy test signal T_D, in response to the test entry signal TM_entry, the test code TM_code, and a reset signal RST. For example, in response to the test entry signal TM_entry, the test code TM_code, and the reset signal RST, the test select circuit 210 may enable one of the redundancy test signal T_R and the dummy test signal T_D, or may disable both the redundancy test signal T_R and the dummy test signal T_D. Furthermore, if the reset signal RST is enabled, the test select circuit 210 may disable the redundancy test signal T_R and the dummy test signal T_D. In more detail, if the test entry signal TM_entry is enabled, the test select circuit 210 may enable one of the redundancy test signal T_R and the dummy test signal T_D, in response to the test code TM_code. If the test entry signal TM_entry is enabled, the test select circuit 210 may disable both the redundancy test signal T_R and the dummy test signal T_D, in response to the test code TM_code. Also, if the reset signal RST is enabled, the test select circuit 210 may disable the redundancy test signal T_R and the dummy test signal T_D.

The decoding select circuit 220 may generate the normal decoding enable signal N_en, the redundancy decoding enable signal R_en, and the dummy decoding enable signal D_en, in response to the redundancy test signal T_R, the dummy test signal T_D, and the active signal ACTB. For example, if both the redundancy test signal T_R and the dummy test signal T_D are disabled and the active signal ACTB is enabled, the decoding select circuit 220 may enable the normal decoding enable signal N_en. If, among the redundancy test signal T_R and the dummy test signal T_D, the redundancy test signal T_R is enabled and the active signal ACTB is enabled, then the decoding select circuit 220 may enable the redundancy decoding enable signal R_en. If, among the redundancy test signal T_R and the dummy test signal T_D, the dummy test signal D_R is enabled and the active signal ACTB is enabled, then the decoding select circuit 220 may enable the dummy decoding enable signal D_en.

Figure 4:
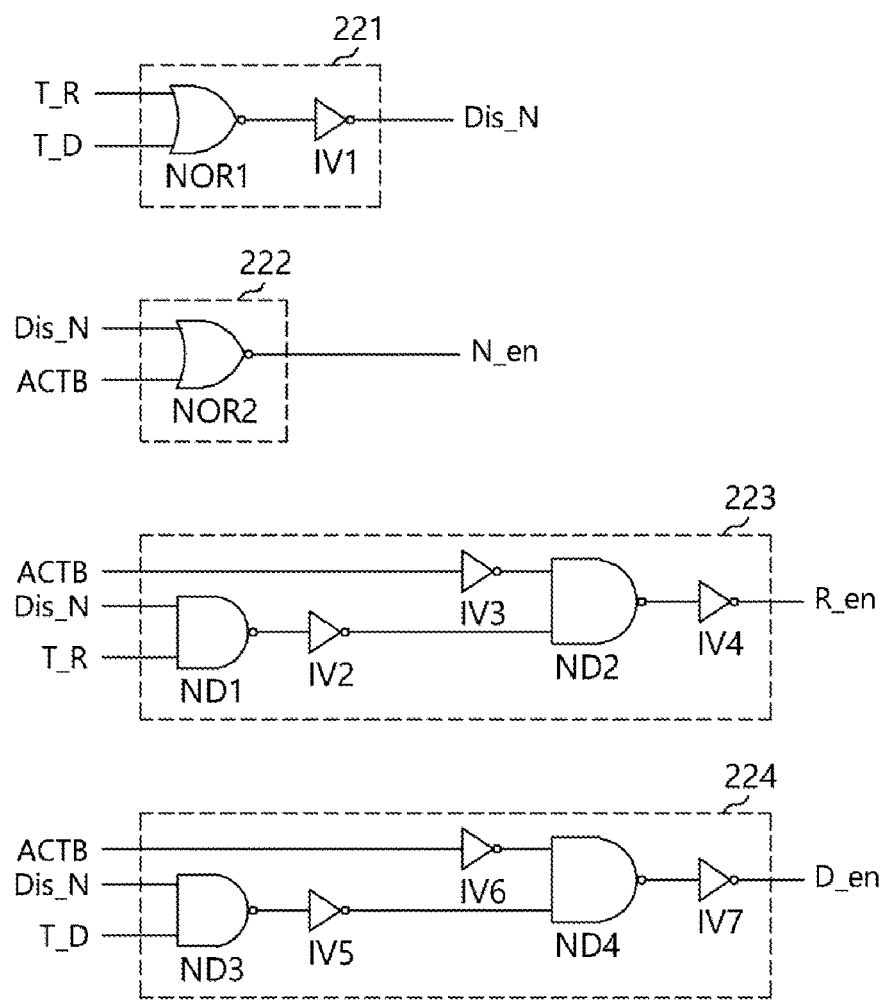
FIG. 4 shows a diagram illustrating a configuration of a decoding select circuit of FIG. 3.

As shown in FIG. 4, the decoding select circuit 220 may include a test determination circuit 221, a normal decoding enable signal output circuit 222, a redundancy decoding enable signal output circuit 223, and a dummy decoding enable signal output circuit 224.

The test determination circuit 221 may generate a test determination signal Dis_N, in response to the redundancy test signal T_R and the dummy test signal T_D. For example, if even one of the redundancy test signal T_R and the dummy test signal T_D is enabled to a high level, then the test determination circuit 221 may enable the test determination signal Dis_N to a high level. If both the redundancy test signal T_R and the dummy test signal T_D are disabled to low levels, then the test determination circuit 221 may disable the test determination signal Dis_N to a low level.

The test determination circuit 221 may be configured to perform a NOR operation and an inversion operation, and may include, for example, a first NOR gate NOR1 and a first inverter IV1. The first NOR gate NOR1 may receive the redundancy test signal T_R and the dummy test signal T_D. The first inverter IV1 may receive an output signal of the first NOR gate NOR1 and output the test determination signal Dis_N.

The normal decoding enable signal output circuit 222 may generate and output the normal decoding enable signal N_en in response to the test determination signal Dis_N and the active signal ACTB. For example, if the test determination signal Dis_N is disabled to a low level and the active signal ACTB is enabled to a low level, then the normal decoding enable signal output circuit 222 may enable the normal decoding enable signal N_en to a high level.

The normal decoding enable signal output circuit 222 may be configured to perform a NOR operation, and may include, for example, a second NOR gate NOR2. The second NOR gate NOR2 may receive the test determination signal Dis_N and the active signal ACTB and output the normal decoding enable signal N_en.

The redundancy decoding enable signal output circuit 223 may generate and output the redundancy decoding enable signal R_en in response to the test determination signal Dis_N, the redundancy test signal T_R, and the active signal ACTB. For example, if both the test determination signal Dis_N and the redundancy test signal T_R are enabled to high levels and the active signal ACTB is enabled to the low level, then the redundancy decoding enable signal output circuit 223 may enable the redundancy decoding enable signal R_en to a high level.

The redundancy decoding enable signal output circuit 223 may be configured to perform a NAND operation and an inversion operation, and may include, for example, first and second NAND gates ND1 and ND2, and second to fourth inverters IV2, IV3, and IV4. The first NAND gate ND1 may receive the test determination signal Dis_N and the redundancy test signal T_R. The second inverter IV2 may receive an output signal of the first NAND gate ND1. The third inverter IV3 may receive the active signal ACTB. The second NAND gate ND2 may receive output signals of the second and third inverters IV2 and IV3. The fourth inverter IV4 may receive an output signal of the second NAND gate ND2 and output the redundancy decoding enable signal R_en.

The dummy decoding enable signal output circuit 224 may generate and output the dummy decoding enable signal D_en in response to the test determination signal Dis_N, the dummy test signal T_D, and the active signal ACTB. For example, if both the test determination signal Dis_N and the dummy test signal T_D are enabled to high levels and the active signal ACTB is enabled to the low level, then the dummy decoding enable signal output circuit 224 may enable the dummy decoding enable signal D_en to a high level.

The dummy decoding enable signal output circuit 224 may be configured to perform a NAND operation and an inversion operation, and may include, for example, third and fourth NAND gates ND3 and ND4, and fifth to seventh inverters IV5, IV6, and IV7. The third NAND gate ND3 may receive the test determination signal Dis_N and the dummy test signal T_D. The fifth inverter IV5 may receive an output signal of the third NAND gate ND3. The sixth inverter IV6 may receive the active signal ACTB. The fourth NAND gate ND4 may receive output signals of the fifth and sixth inverters IV5 and IV6. The seventh inverter IV7 may receive an output signal of the fourth NAND gate ND4 and output the dummy decoding enable signal D_en.

The operation of the semiconductor memory apparatus 150 in accordance with an embodiment having the above-indicated configuration is described below.

In a test, i.e., when a test entry signal TM_entry is enabled, the test decoding select circuit 200 of FIG. 2 may generate a normal decoding enable signal N_en, a redundancy decoding enable signal R_en, and a dummy decoding enable signal D_en, in response to a test code TM_code and an active signal ACTB.

If the test entry signal TM_entry is enabled and the active signal ACTB is enabled, then the test decoding select circuit 200 may enable one of the normal decoding enable signal N_en, the redundancy decoding enable signal R_en, and the dummy decoding enable signal D_en, in response to the test code TM_code.

The operation of the test decoding select circuit 200 is described in more detail with reference to FIG. 3.

The test decoding select circuit 200 may include the test select circuit 210 and the decoding select circuit 220.

If the test entry signal TM_entry is enabled, the test select circuit 210 may generate the redundancy test signal T_R and the dummy test signal T_D, in response to the test code TM_code. For example, if the test entry signal TM_entry is enabled, then the test select circuit 210, in response to the test code TM_code, may enable the redundancy test signal T_R, may enable the dummy test signal T_D, or may disable both the redundancy test signal T_R and the dummy test signal T_D. Furthermore, if the reset signal RST is enabled, the test select circuit 210 may disable both the redundancy test signal T_R and the dummy test signal T_D.

The decoding select circuit 220 may generate the normal decoding enable signal N_en, the redundancy decoding enable signal R_en, and the dummy decoding enable signal D_en, in response to the redundancy test signal T_R, the dummy test signal T_D, and the active signal ACTB. For example, the decoding select circuit 220 may enable one of the normal decoding enable signal N_en, the redundancy decoding enable signal R_en, and the dummy decoding enable signal D_en, in response to the redundancy test signal T_R, the dummy test signal T_D, and the active signal ACTB.

If the active signal ACTB is enabled when both the redundancy test signal T_R and the dummy test signal T_D have been disabled, then the decoding select circuit 220 may enable the normal decoding enable signal N_en.

If the active signal ACTB is enabled when, among the redundancy test signal T_R and the dummy test signal T_D, the redundancy test signal T_R has been enabled, then the decoding select circuit 220 may enable the redundancy decoding enable signal R_en.

If the active signal ACTB is enabled when, among the redundancy test signal T_R and the dummy test signal T_D, the dummy test signal D_R has been enabled, then the decoding select circuit 220 may enable the dummy decoding enable signal D_en.

If the normal decoding enable signal N_en is enabled, then the normal line decoding circuit 300 of FIG. 2 may decode an address ADD and selectively enable a normal line N_L<0:k>.

If the redundancy decoding enable signal R_en is enabled, then the redundancy line decoding circuit 400 of FIG. 2 may decode the address ADD and selectively enable a redundancy line R_L<0:m>.

If the dummy decoding enable signal D_en is enabled, then the dummy line decoding circuit 500 of FIG. 2 may decode the address ADD and selectively enable a dummy line D_L<0:n>.

As described above, in a semiconductor memory apparatus in accordance with an embodiment, during a test operation, a normal line, a redundancy line, and a dummy line may be selectively enabled in response to an address. Thus, when a defect occurs in the semiconductor memory apparatus, a test for determining a defective line among the normal line, the redundancy line, and the dummy line may be easily performed. Here, the term "normal line" may be interpreted as a term covering or including both the normal bit line N_BL and the normal word line N_WL of FIG. 1, the term "redundancy line" may be interpreted as a term covering or including both the redundancy bit line R_BL and the redundancy D_BL of FIG. 1, and the term "dummy line" may be interpreted as a term covering or including both the dummy bit line D_BL and the dummy word line D_WL of FIG. 1. Hence, it is to be noted that the semiconductor memory apparatus in accordance with an embodiment may be applied to each of a bit line and a word line. Furthermore, the semiconductor memory apparatus in accordance with an embodiment may be applied to a line including a normal line, a redundancy line, or the dummy line among lines to be selected in response to an address even if the line is neither a bit line nor a word line.

While various embodiments have been described above, it will be understood to those skilled in the art that the embodiments described are by way of example only. Accordingly, a semiconductor memory apparatus consistent with the present teachings should not be limited based on the described embodiments. Rather, a semiconductor memory apparatus having the same configuration as described herein should be limited in light of the claims that follow when taken in conjunction with the above description and accompanying drawings.

What is claimed is:
1. A semiconductor memory apparatus comprising:
   a test decoding select circuit configured to generate a normal decoding enable signal, a redundancy decoding enable signal, and a dummy decoding enable signal, in response to a test entry signal, a test code, and an active signal, wherein the test decoding select circuit comprises:
a test select circuit configured to generate a redundancy test signal and a dummy test signal in response to the test entry signal and the test code; and
a decoding select circuit configured to generate the normal decoding enable signal, the redundancy decoding enable signal, and the dummy decoding enable signal, in response to the redundancy test signal, the dummy test signal, and the active signal.

2. The semiconductor memory apparatus according to claim 1, further comprising:
a normal line decoding circuit configured to selectively enable a normal line in response to an address and the normal decoding enable signal;
a redundancy line decoding circuit configured to selectively enable a redundancy line in response to the address and the redundancy decoding enable signal; and
a dummy line decoding circuit configured to selectively enable a dummy line in response to the address and the dummy decoding enable signal.

3. The semiconductor memory apparatus according to claim 2, wherein, when test entry signal is enabled, the test decoding select circuit enables one of the normal decoding enable signal, the redundancy decoding enable signal, and the dummy decoding enable signal, in response to the test code and the active signal.

4. The semiconductor memory apparatus according to claim 2, wherein, when the normal decoding enable signal is enabled, the normal line decoding circuit selectively enables the normal line in response to the address.

5. The semiconductor memory apparatus according to claim 2, wherein, when the redundancy decoding enable signal is enabled, the redundancy line decoding circuit selectively enables the redundancy line in response to the address.

6. The semiconductor memory apparatus according to claim 2, wherein, when the dummy decoding enable signal is enabled, the dummy line decoding circuit selectively enables the dummy line in response to the address.

7. The semiconductor memory apparatus according to claim 2,
wherein the normal line includes a normal bit line and a normal word line,
wherein the redundancy line includes a redundancy bit line and a redundancy word line, and
wherein the dummy line includes a dummy bit line and a dummy word line.

8. The semiconductor memory apparatus according to claim 1, wherein, when the test entry signal is enabled, in response to the test code, the test select circuit enables one of the redundancy test signal and the dummy test signal, or disables both the redundancy test signal and the dummy test signal.

9. The semiconductor memory apparatus according to claim 8, wherein the test select circuit disables both the redundancy test signal and the dummy test signal in response to a reset signal.

10. The semiconductor memory apparatus according to claim 1,
wherein, when both the redundancy test signal and the dummy test signal are enabled, the decoding select circuit enables the normal decoding enable signal when the active signal enabled, wherein, when, among the redundancy test signal and the dummy test signal, the redundancy test signal is enabled, the decoding select circuit enables the redundancy decoding enable signal when the active signal is enabled, and
wherein, when, among the redundancy test signal and the dummy test signal, the dummy test signal is enabled, the decoding select circuit enables the dummy decoding enable signal when the active signal is enabled.

11. The semiconductor memory apparatus according to claim 10, wherein the decoding select circuit comprises:
a test determination circuit configured to generate a test determination signal in response to the redundancy test signal and the dummy test signal;
a normal decoding enable signal output circuit configured to generate the normal decoding enable signal in response to the test determination signal and the active signal;
a redundancy decoding enable signal output circuit configured to generate the redundancy decoding enable signal in response to the test determination signal, the active signal, and the redundancy test signal; and
a dummy decoding enable signal output circuit configured to generate the dummy decoding enable signal in response to the test determination signal, the active signal, and the dummy test signal.

12. The semiconductor memory apparatus according to claim 11,
wherein, when both the redundancy test signal and the dummy test signal are disabled, the test determination circuit disables the test determination signal, and
wherein, when at least one of the redundancy test signal and the dummy test signal is enabled, the test determination circuit enables the test determination signal.

13. The semiconductor memory apparatus according to claim 11, wherein, when the test determination signal is disabled and the active signal is enabled, the normal decoding enable signal output circuit enables the normal decoding enable signal.

14. The semiconductor memory apparatus according to claim 11, wherein, when all of the test determination signal, the redundancy test signal, and the active signal are enabled, the redundancy decoding enable signal output circuit enables the redundancy decoding enable signal.

15. The semiconductor memory apparatus according to claim 11, wherein, when all of the test determination signal, the dummy test signal, and the active signal are enabled, the dummy decoding enable signal output circuit enables the dummy decoding enable signal.

16. The semiconductor memory apparatus according to claim 1, further comprising:
a normal line decoding circuit configured to selectively enable a normal line in response to an address and the normal decoding enable signal.

17. The semiconductor memory apparatus according to claim 1, further comprising:
a redundancy line decoding circuit configured to selectively enable a redundancy line in response to an address and the redundancy decoding enable signal.

18. The semiconductor memory apparatus according to claim 1, further comprising:
a dummy line decoding circuit configured to selectively enable a dummy line in response to an address and the dummy decoding enable signal.

19. A semiconductor memory apparatus, comprising:
a normal line decoding circuit configured to select a normal line;

a redundancy line decoding circuit configured to select a redundancy line;

a dummy line decoding circuit configured to select a dummy line; and a test decoding select circuit including a test select circuit configured to generate a redundancy test signal and a dummy test signal in response to a test entry signal and a test code, and a decoding select circuit configured to generate a normal decoding enable signal for selecting the normal line decoding circuit, a redundancy decoding enable signal for selecting the redundancy line decoding circuit, and a dummy decoding enable signal for selecting the dummy line decoding circuit, in response to the redundancy test signal, the dummy test signal, and an active signal.

* * * * *